United States Patent
Barsun et al.

(10) Patent No.: US 6,788,544 B1
(45) Date of Patent: Sep. 7, 2004

(54) FIELD REPLACEABLE UNIT ACCESS DEVICE AND METHOD

(75) Inventors: Stephan Karl Barsun, Auburn, CA (US); Irving McKenzie Birmingham, Rocklin, CA (US); Robert William Dobbs, Grantie Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/411,671

(22) Filed: Apr. 11, 2003

(51) Int. Cl.[7] .................................................. H05K 7/16
(52) U.S. Cl. ..................... 361/727; 312/323.6; 235/695; 713/300
(58) Field of Search ............................... 361/683–687, 361/724–727; 312/223.1–223.6, 333; 235/695, 395; 713/300

(56) References Cited

U.S. PATENT DOCUMENTS

| | | |
|---|---|---|
| 2,789,024 A | 4/1957 | Heisler ........................ 312/333 |
| 3,708,618 A | 1/1973 | Hofmeister et al. ......... 348/839 |
| 4,084,250 A | 4/1978 | Albertine et al. ............ 361/887 |
| 4,977,532 A | 12/1990 | Borkowicz et al. .......... 361/683 |
| 5,311,397 A | 5/1994 | Harshberger et al. ....... 361/683 |
| 5,571,256 A | 11/1996 | Good et al. .................... 211/26 |
| 5,649,750 A | 7/1997 | Ishii et al. ................. 312/223.2 |
| 5,737,184 A | 4/1998 | Lai ............................. 361/683 |
| 6,010,065 A | 1/2000 | Ramachandran et al. ... 235/379 |
| 6,025,989 A | 2/2000 | Ayd et al. ..................... 361/695 |
| 6,055,152 A | 4/2000 | Felcman et al. ............. 361/683 |
| 6,128,186 A | * 10/2000 | Feierbach .................... 361/683 |
| 6,304,437 B1 | 10/2001 | Foo et al. ..................... 361/683 |
| 6,305,556 B1 | 10/2001 | Mayer .......................... 211/26 |
| 6,525,932 B1 | * 2/2003 | Ohnishi et al. .............. 361/686 |

OTHER PUBLICATIONS

U.S. patent application Publication No. US 2001/0037985 A1 published Nov. 8, 2001 for "Computer Component Rack Mounting Arrangement" of Paily Varghese, Robert J. Hastings and Paul E. Westphall

* cited by examiner

Primary Examiner—Hung Van Duong

(57) ABSTRACT

Disclosed herein are exemplary embodiments of a Field Replaceable Unit (FRU) access device an electronic device.

26 Claims, 8 Drawing Sheets

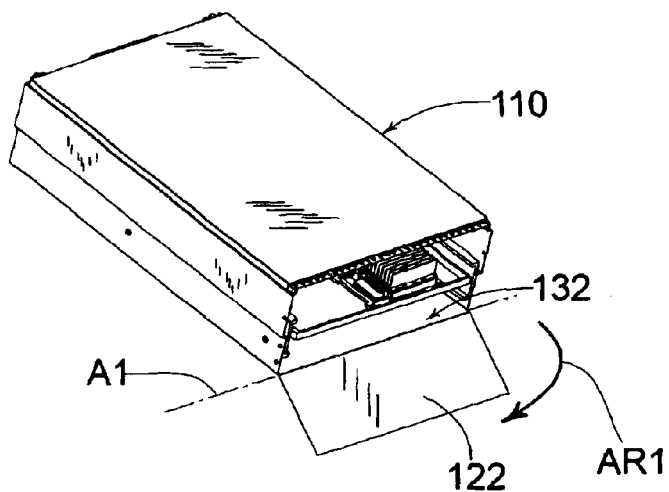
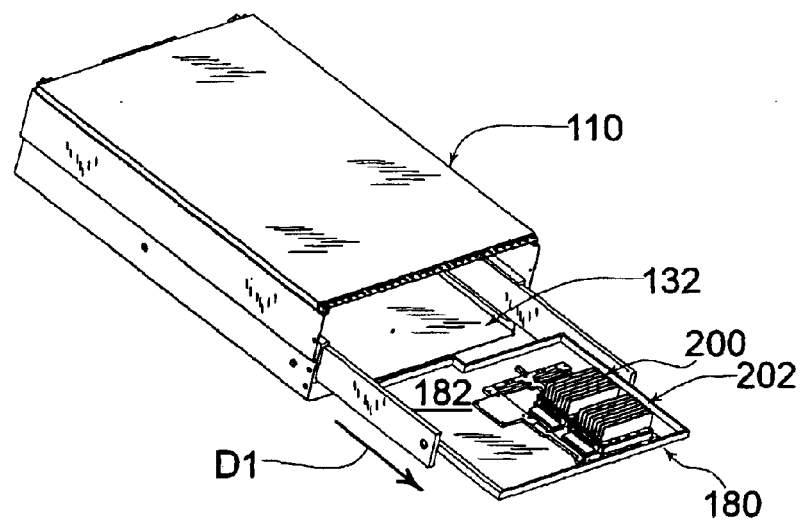
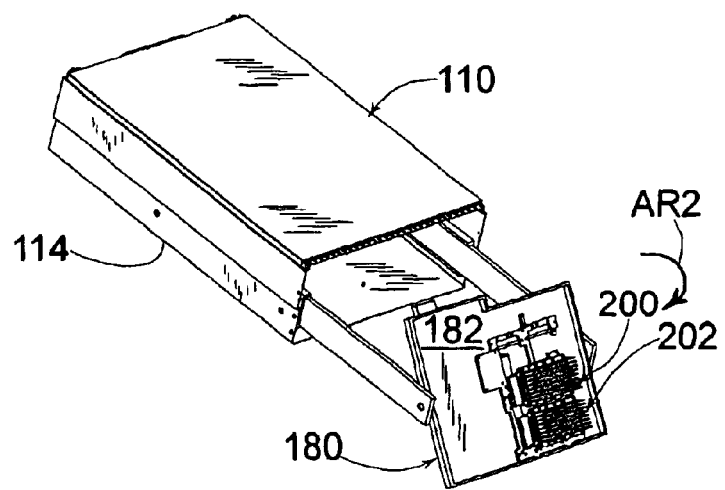
Fig. 8

FIELD REPLACEABLE UNIT ACCESS
DEVICE AND METHOD

RELATED APPLICATION

The present application is related to U.S. patent application Ser. No. 10/411,699 for PIVOTED FIELD REPLACEABLE UNIT APPARATUS AND METHOD of Stephen K. Barson et al., filed on Apr. 11, 2003, which is hereby specifically incorporated by reference for all that is disclosed therein.

BACKGROUND

Electronic systems contain devices that often need repair, replacement, or upgrading during the lifespan of the systems. These devices are replaced after they expire. Various apparatus and methods have been developed to improve the process of replacing these devices.

SUMMARY

In one exemplary embodiment, apparatus for electronically processing information may include: a chassis; a frame translatingly and pivotally attached to the chassis; and an electronic component removably attached to the frame.

BRIEF DESCRIPTION OF THE DRAWING

Illustrative embodiments are shown in Figures of the Drawing in which:

FIG. 8 shows a series of 'snapshots' of the electronic device of FIG. 2 as components located therein are accessed.

DETAILED DESCRIPTION

Figure 1:
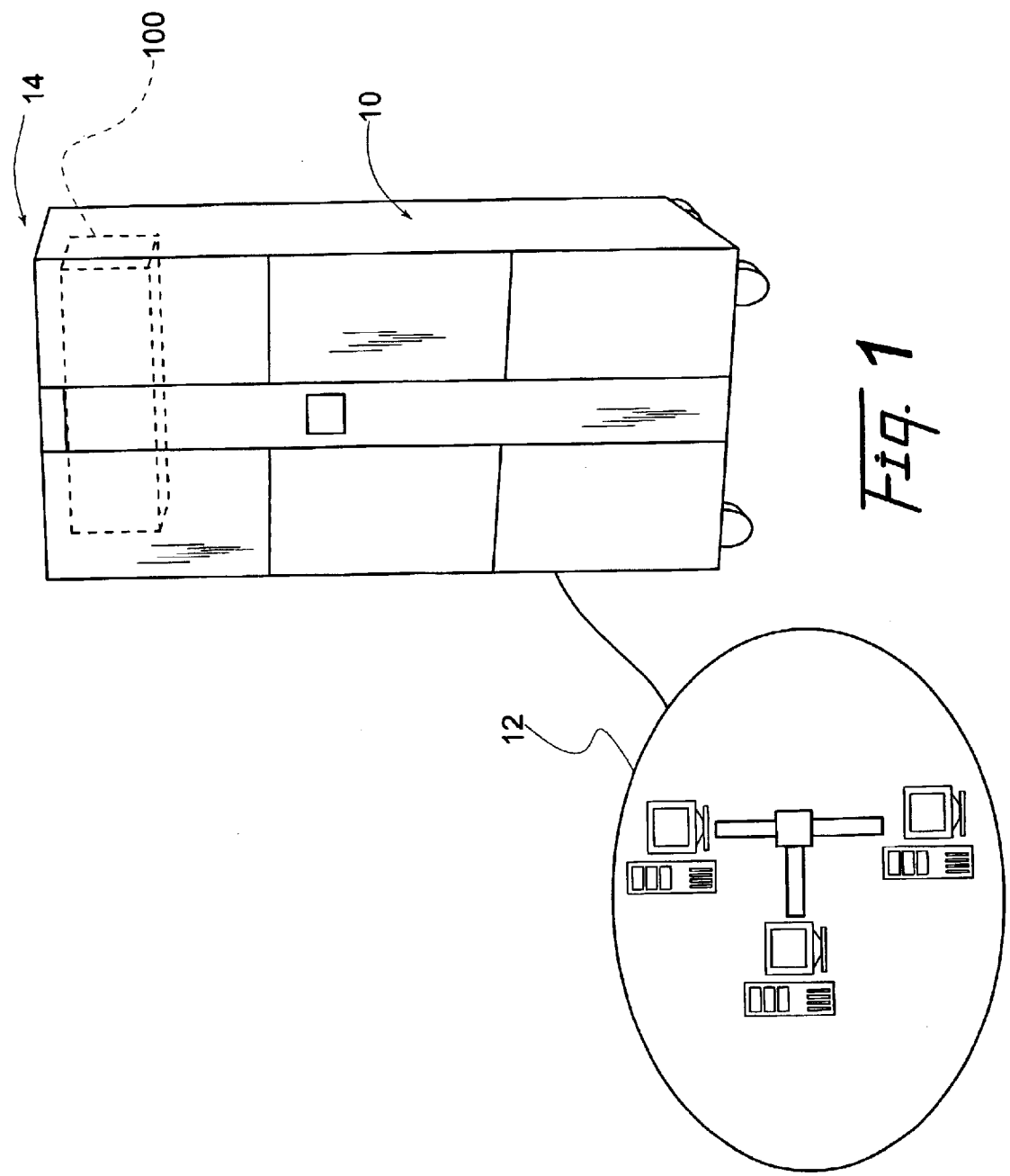
FIG. 1 shows an exemplary embodiment of an electronic device contained within a rack.

FIG. 1 illustrates a rack 10 that may be attached to a computer network 12. The rack 10 may include devices for electronically processing information such as a plurality of computer systems (e.g. server 100). The server 100 may be located at an uppermost portion 14 of the rack 10. Components located within the server 100 may require replacement. When the server 100 is located in the uppermost portion 14 of the rack 10, the removal and/or replacement of components may be particularly difficult. The present FRU access device allows components located within the server 100 to be readily accessed for repair or replacement. This accessibility simplifies the processes of removing and/or replacing these components while the server 100 remains located in the rack 10.

Figure 2:
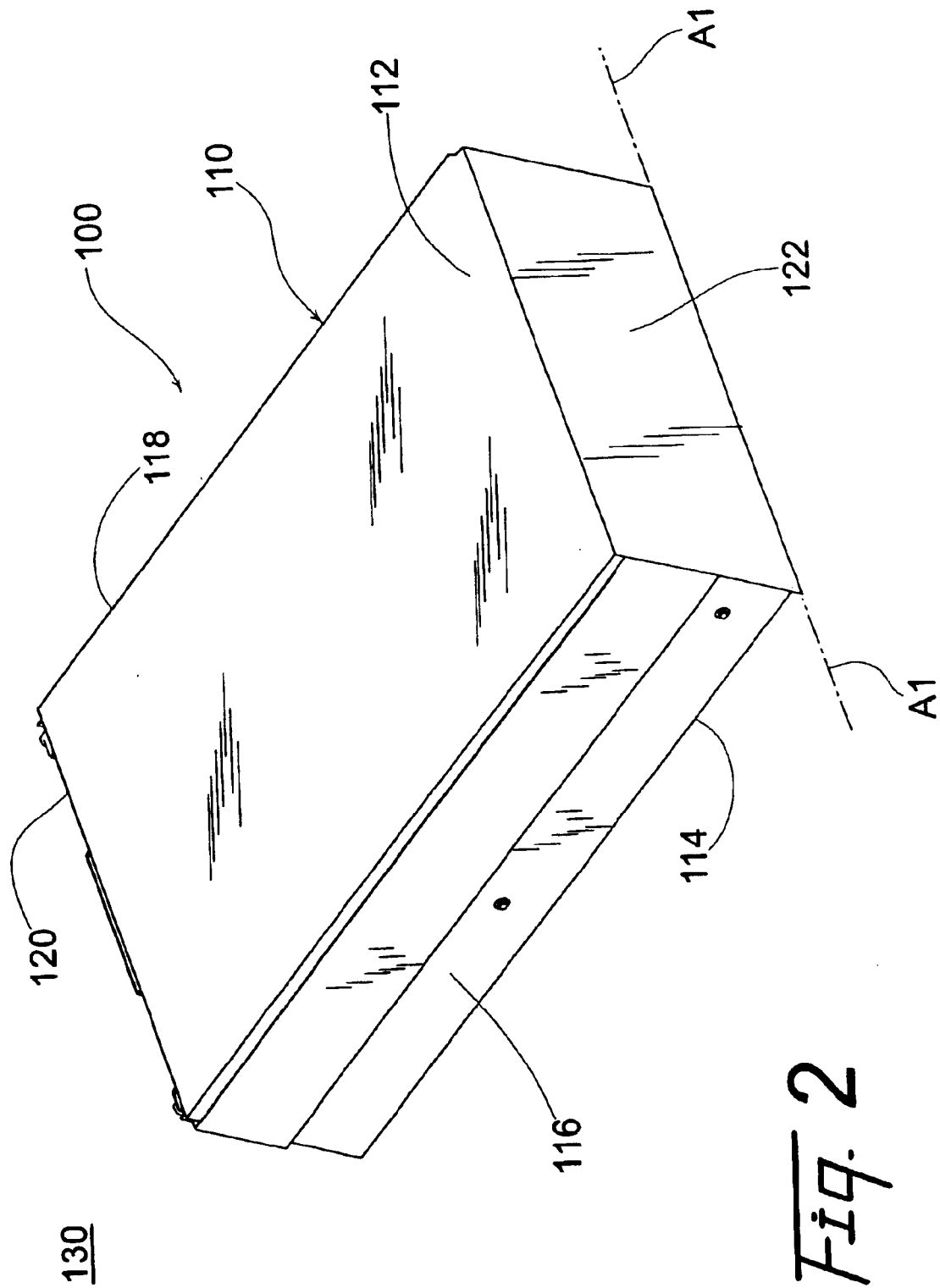
FIG. 2 shows a perspective view of an exemplary embodiment of an electronic device provided with an access door.
Figure 3:
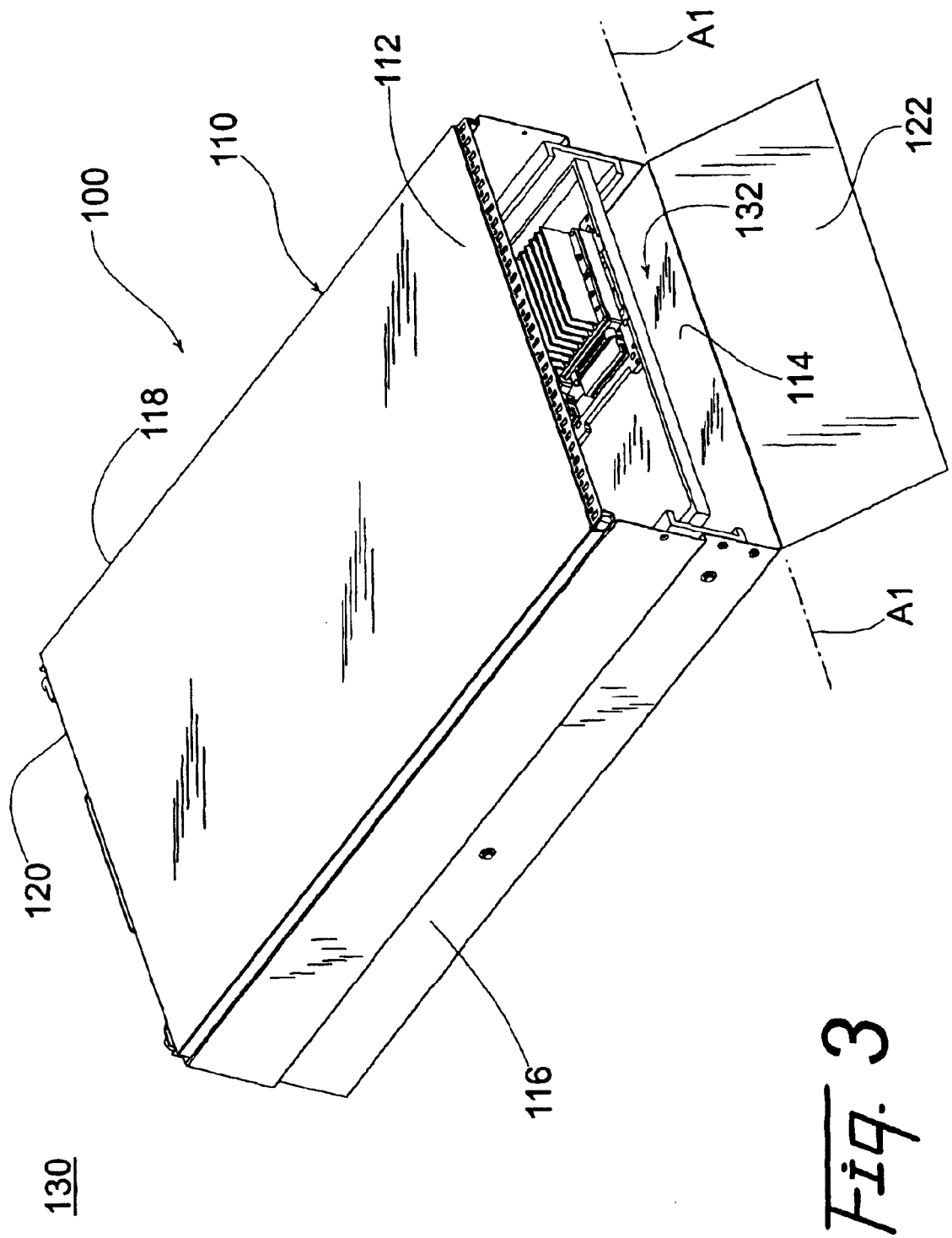
FIG. 3 shows a perspective view of the electronic device of FIG. 2 with the access door in an open position.

FIG. 2 illustrates a perspective view of the server 100. With reference to FIG. 2, the server 100 may be encased by a chassis 110. The chassis 110 may be provided with a top panel 112, a bottom panel 114, a first side panel 116, a second side panel 118, a rear panel 120 and a front panel 122. The panels 112, 114, 116, 118, 120 and 122 of the chassis 110 may be formed in a somewhat parallelepiped configuration substantially separating an external portion 130 from an internal portion 132 (FIG. 3). The front panel 122 may be movably attached to the bottom panel 114 thereby permitting passage between the external portion 130 and the internal portion 132. One exemplary configuration for movably attaching the front panel 122 to the bottom panel 114 may include pivotally attaching the front panel 122 to the bottom panel 114 along a first axis A1 (although a variety of other attachment methods may be utilized).

It is to be understood that terms such as 'front', 'back', 'top', 'bottom', 'horizontal', 'vertical', 'underneath' and the like are used herein for illustrative purposes only. In actual use, the server 100 can be configured and/or used in almost any orientation, thus making terms such as 'front', 'back', 'top', 'bottom', 'horizontal', 'vertical', etc. relative to the orientation of the server 100.

FIG. 3 illustrates a perspective view of the server 100 with the front panel 122 positioned to allow passage between the external and internal portions 130, 132. This positioning of the front panel 122 may occur, for example, by pivoting the front panel 122 about the first axis A1. This pivoting may occur by a user (e.g. a service technician) rotating the front panel 122 about the first axis A1.

Figure 4:
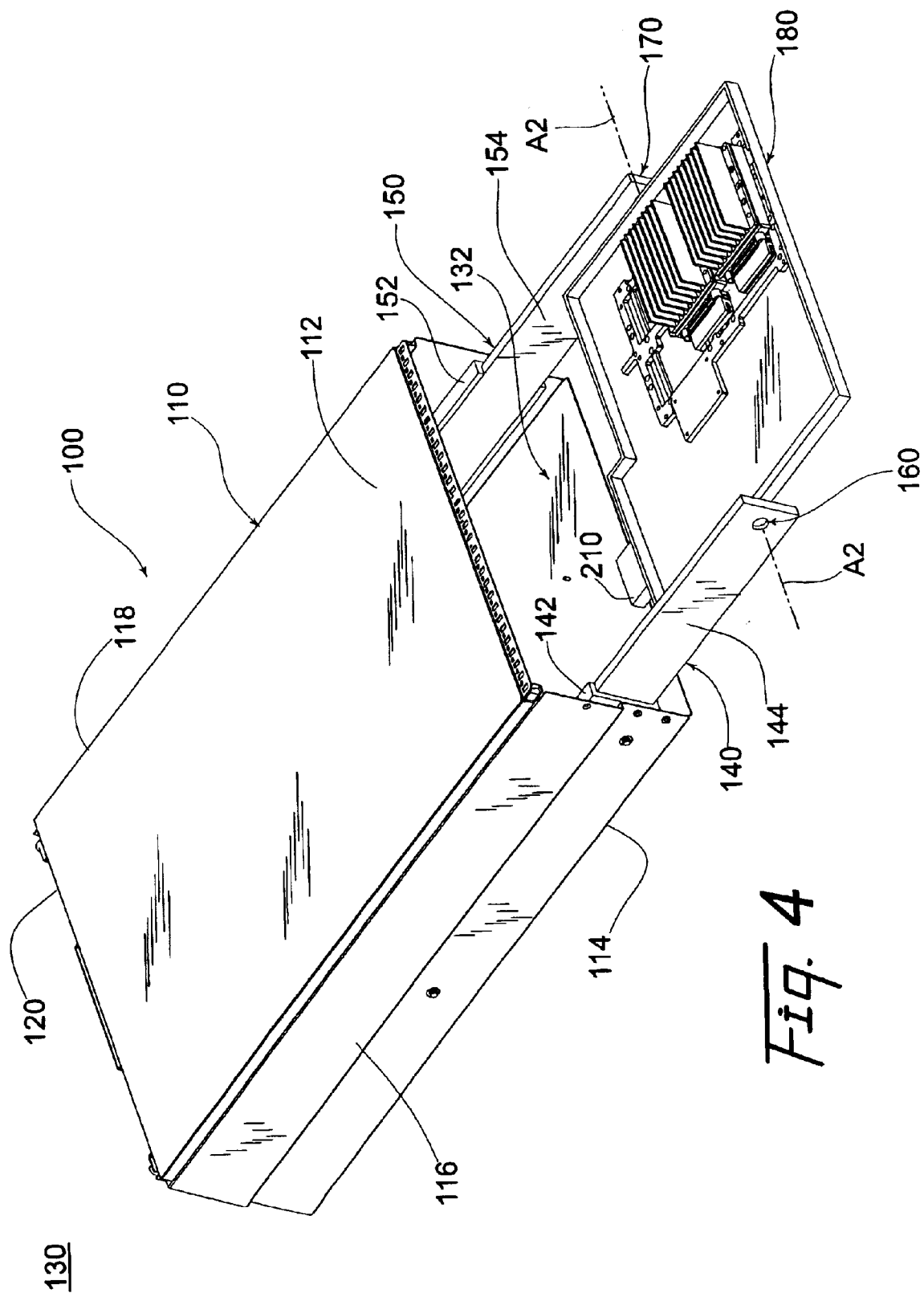
FIG. 4 shows a perspective view of the server of FIG. 2 with internal components thereof located in an external portion of the server.

With the front panel 122 positioned as illustrated in FIG. 3, internal components of the server 100 may be accessed. FIG. 4 illustrates a perspective view of the server 100 with the front panel 122 removed therefrom and exemplary internal components displaced from the internal portion 132. With reference to FIG. 4, the server 100 may be provided with a first slide 140. The first slide 140 may include a guide 142 and a rail 144. In one exemplary embodiment, the guide 142 may be attached to the first side panel 116 such that it resides within the internal portion 132 of the chassis 110. The rail 144 may slide relative to the guide 142 thereby making it 'translatingly attached' to the chassis 110. This translational attachment results in the rail 144 being capable of moving from the internal portion 132 to the external portion 130 of the chassis 110.

With continued reference to FIG. 4, the server 100 may be provided with a second slide 150. The second slide 150 may include a guide 152 and a rail 154. In one exemplary embodiment, the guide 152 may be attached to the second side panel 118 such that it resides within the internal portion 132 of the chassis 110. The rail 154 may slide relative to the guide 152 thereby making it 'translatingly attached' to the chassis 110. This translational attachment results in the rail 154 being capable of moving from the internal portion 132 to the external portion 130 of the chassis 110.

Figure 5:
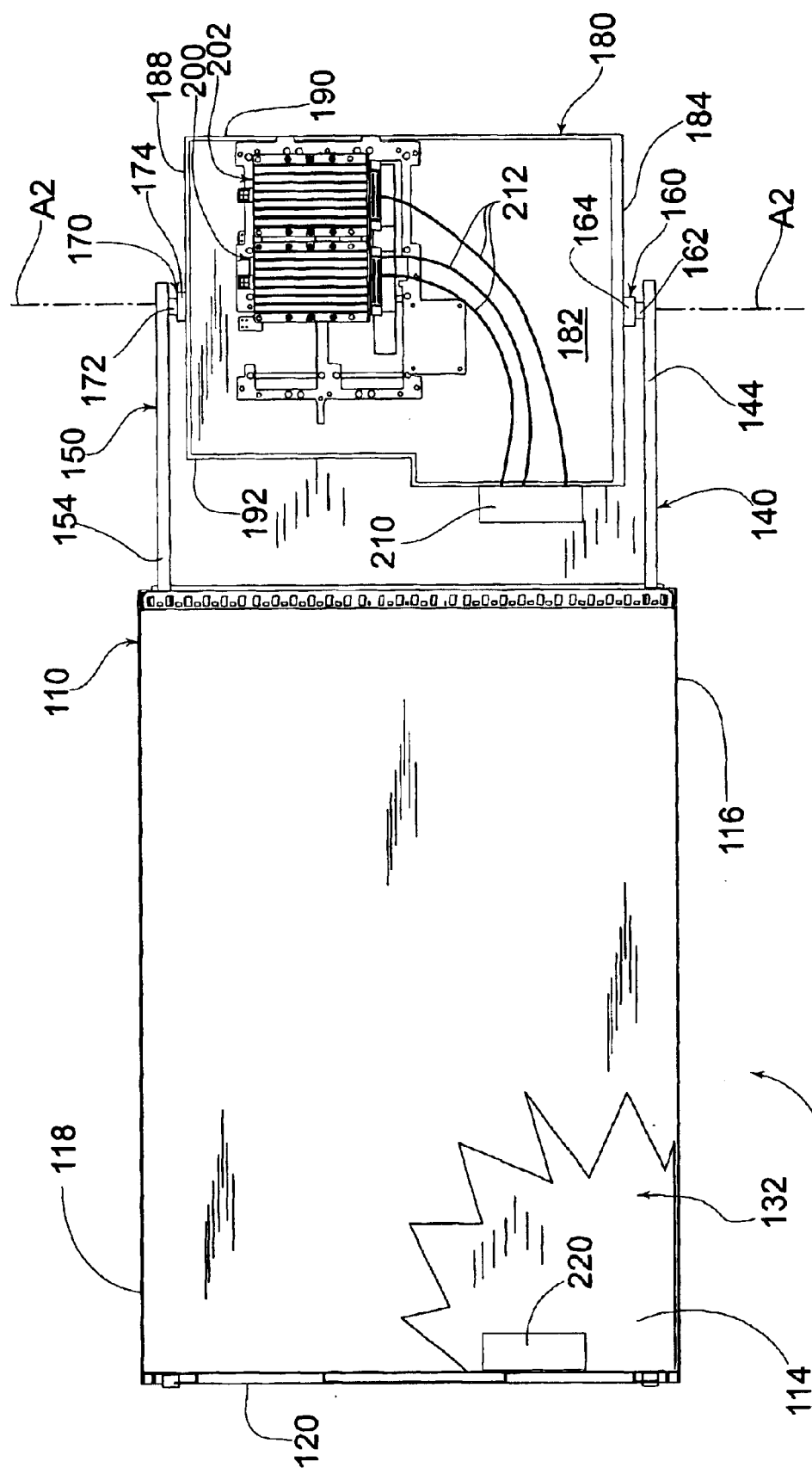
FIG. 5 shows a top plan view of the electronic device of FIG. 4 with internal components thereof located in the external portion of the electronic device.

With continued reference to FIG. 4, the server 100 may be provided with a first pivot 160. The first pivot 160 may include a first member 162 and a second member 164, FIG. 5. With reference to FIG. 5 illustrating a top view of the server 100, the first member 162 may pivot with respect to the second member 164 about a second axis A2. The first member 162 of the first pivot 160 may be fixedly attached to the rail 144 of the first slide 140. The second member 164 of the first pivot 160 may be pivotally supported by the first member 162, thereby allowing rotation of the second member 164 with respect to the rail 144 of the first slide 140.

With reference to FIG. 4, the server 100 may be provided with a second pivot 170. The second pivot 170 may be 'aligned' with the first pivot 160 thereby resulting in a common axis (e.g. second axis A2) of rotation for the pivots 160, 170. The second pivot 170 may include a first member 172 and a second member 174, FIG. 5. With reference to FIG. 5, the first member 172 may pivot with respect to the second member 174 about the second axis A2. The first member 172 of the second pivot 170 may be fixedly attached to the rail 154 of the second slide 150. The second member 174 of the second pivot 170 may be pivotally supported by the first member 172, thereby allowing rotation of the second member 174 with respect to the rail 154 of the second slide 150.

Figure 6:
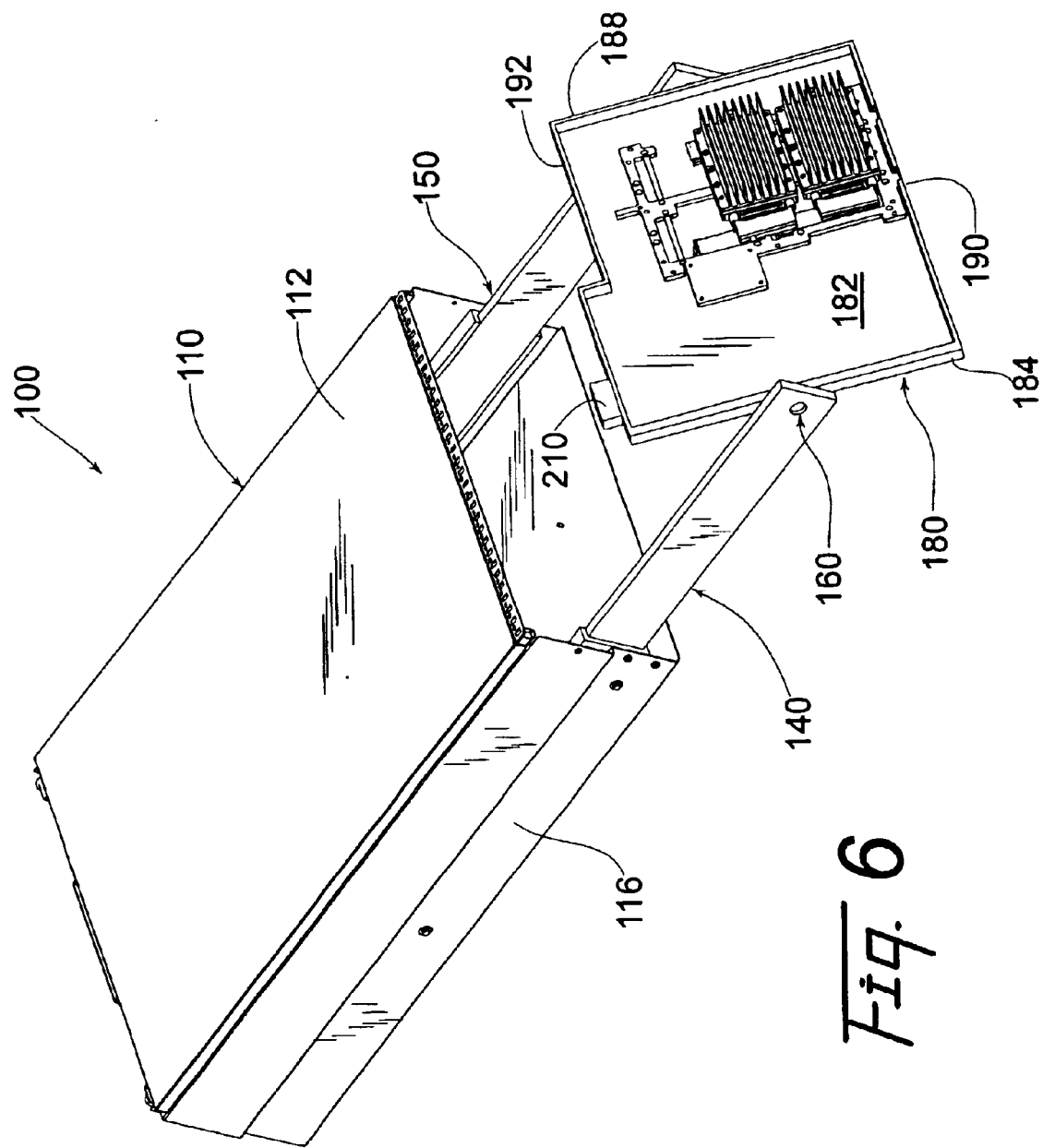
FIG. 6 shows a perspective view of the electronic device of FIG. 4 with a frame rotated to allow access to components located on the frame.

FIG. 5 illustrates a top plan view of the server 100 in a configuration wherein the rails 144, 154 are located in the external portion 130 of the chassis 110. With reference to FIG. 5, the server 100 may be provided with a frame 180. The frame 180 may be provided with a top surface 182, a bottom surface 184 (FIG. 6), a first edge 186, a second edge 188, a front edge 190 and a back edge 192. The top surface 182 may be substantially parallel to and oppositely disposed from the bottom surface 184 (FIG. 6). The first edge 186 may be substantially parallel to and oppositely disposed from the second edge 188. The frame 180 may be attached to the chassis 110 via the first and second pivots 160, 170 (which, in turn, may be attached to the slides 140, 150). The second member 164 of the first pivot 160 may be attached to the first edge. 186 of the frame 180. The second member 174 of the second pivot 170 may be attached to the second edge 188 of the frame 180. This attachment of the frame 180 to the slides 140, 150 via the pivots 160, 170 results in the frame being 'pivotally attached' to the chassis 110. This pivotal attachment results in the first slide 140 being 'registered' to the second slide 150. By being registered, movement of one of the slides (e.g., first slide 140) is mimicked by the other slide (e.g. second slide 150).

FIG. 6 illustrates a pivoted condition wherein the frame 180 has been pivoted with respect to the chassis 110. With reference to FIG. 6, by incorporating the present Field Replaceable Unit (FRU) access device into the server 100, a user can rotate the frame 180 to improve accessibility to components located on the frame 180.

Figure 7:
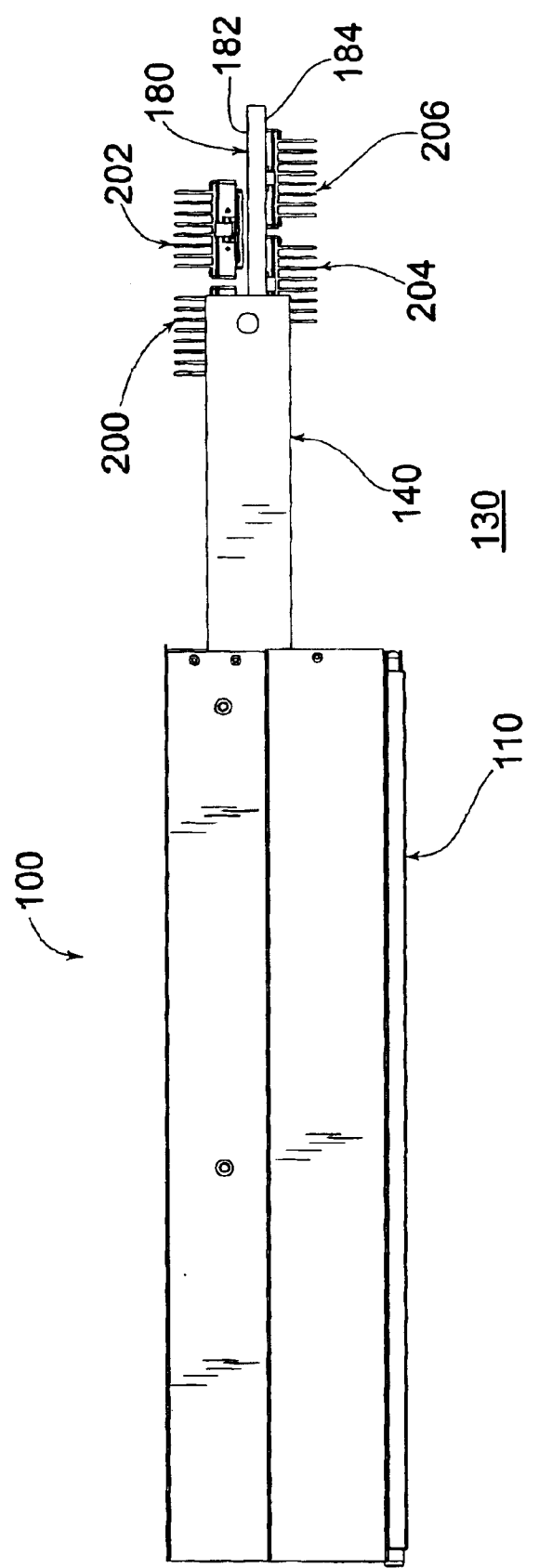
FIG. 7 shows a side elevation view of the electronic device of FIG. 4.

FIG. 7 illustrates a side view of the server 160 with the frame 180 positioned in the external portion 130 of the chassis 110. With reference to FIG. 6, the frame 180 may be provided with a plurality of Field Replaceable Units that are commonly referred to herein as 'FRUs'. FRUs may be any type of a variety of components such as, for example, power supplies, heat sinks, fans, processors, capacitors, circuit boards, etc. It is to be understood that FRUs may be any type of component and the previous examples are provided for illustrative purposes only. FIG. 7 illustrates FRUs that include processors and heat sinks; these FRUs may include a first FRU 200, a second FRU 202 a third FRU 204 and a fourth FRU 206. The first and second FRUs 200, 202 may be 'removably attached' to the top surface 182 of the frame 180. The third and fourth FRUs 204, 206 may be 'removably attached' to the bottom surface 184 of the frame 180. As used herein, the term 'removably attached' refers to components, such as FRU 200, that are removable from the frame 180 by acting upon some element (such as, for example, a lever, a fastener, a friction fit, etc.).

With reference to FIG. 5, the frame 180 may be provided with a connector 210. The connector 210 may be electrically interfaced with various components, such as the first FRU 200 and the second FRU 202, via conductors 212. As also illustrated in a cut-away portion of the chassis 110 in FIG. 5, the chassis 110 may be provided with a receptacle 220. The receptacle 220 may be fixedly attached to the chassis 110. The receptacle 220 may be configured to receive the connector 210, thereby permitting electrical communication therebetween.

Having provided a description of one exemplary embodiment of the FRU access device, a description of using the device will now be provided.

FIG. 8 illustrates a series of 'snapshots' of the present FRU access device while it is being used. It is to be understood that these snapshots are provided for illustrative purposes only and that they depict conditions which may only exist for a brief period of time during the entire process. The first snapshot of FIG. 8 illustrates the process of gaining access to the internal portion 132 of the chassis 110. In order to gain access to the internal portion 132, a user may rotate the front panel 122 about the first axis A1 as represented by a first arrow AR1.

After gaining access to the internal portion 132 of the chassis 110, the user may apply a force to the frame 180 to cause movement of the frame 180 in a first direction D1 as illustrated in the second snapshot of FIG. 8. This movement of the frame 180 in the first direction D1 may occur as the rails 144, 154 move with respect to the guides 152, 164 of the slides 150, 160, respectively. This movement of the frame 180 may result in the connector 210 disengaging from the receptacle 220, FIG. 5.

After the rails 144, 154 reach the extent of their travel range, the frame 180 may be pivoted to access the FRUs 200, 202 located on the first top surface 182 of the frame 180 as illustrated in the third snapshot of FIG. 5. This rotation of the frame 180 may result in the frame 180 moving from a condition wherein the frame 180 is substantially parallel to the bottom panel 114 of the chassis 110 to a non-parallel condition wherein the frame 180 is transverse to the bottom panel 114.

If the server 100 is located at the uppermost portion 14 of the rack 10 as illustrated in FIG. 1, the user may rotate the frame 180 in a second arrow 'AR2' to a position wherein the top surface 182 of the frame 180 faces 'down'. This positioning of the frame 180 may simplify the process of removing one of the FRUs (e.g. first FRU 200) as it is within reaching distance. Once the first FRU 200 is removed from the frame 180, a replacement FRU substantially similar to the first FRU 200 may be attached to the frame 180.

After the replacement FRU (e.g. first FRU 200) has been attached to the frame 180, the process of removing the FRU may be reversed.

In one exemplary embodiment, the connector 210 may be attached to the receptacle 220 via a ribbon or flex cable (not shown). This attachment may allow for the FRU access device to be utilized while the system is on. As used herein, the term 'on' refers to a server 100 that may remain online while the process of replacing a component (e.g. first FRU 200) occurs.

In another exemplary embodiment, the server 100 may be any type of device for electronically processing information such as, for example, computer systems in general, network switches, audio racks, data acquisition equipment, telecommunications equipment, etc.

While illustrative embodiments have been described in detail herein, it is to be understood that the concepts may be otherwise variously embodied and employed and that the appended claims are intended to be construed to include such variations except insofar as limited by the prior art.

We claim:

1. An electronic apparatus comprising:
   a chassis;
   a frame translatingly and pivotally attached to said chassis; and
   an electronic component removably attached to said frame;
   a first pivot attached to said frame; and
   a second pivot attached to said frame, said second pivot being aligned with said first pivot.

2. The apparatus of claim 1 and further comprising:
   a first slide attached to said chassis and said first pivot.

3. The apparatus of claim 1 and further comprising: a second slide attached to said chassis and said second pivot.

4. The apparatus of claim 1 and further comprising:
an access door formed in said chassis, wherein said frame is translatable through said access door.

5. The apparatus of claim 1 wherein:
said apparatus comprises a first condition and a second condition;
said chassis defines a bottom;
in said first condition, said frame is parallel to said bottom; and
in said second condition, said frame is transverse to said bottom.

6. The apparatus of claim 1 and further comprising:
a connector attached to said frame, said connector electrically interfaced with said electronic component;
a receptacle attached to said chassis; and
wherein said receptacle electronically couples with said connector.

7. The apparatus of claim 2 wherein:
said slide comprises:
a guide formed on said first slide;
a rail slidingly interfaced with said guide; and
said first pivot is attached to said rail.

8. The apparatus of claim 3 wherein said first slide is registered to said second slide.

9. A method of servicing a computer system, said method comprising:
providing a chassis comprising an opening;
providing a frame translatable through said opening;
providing an electronic component removably attached to said frame;
translating said frame through said opening;
pivoting said frame relative to said chassis; and
removing said electronic component from said frame.

10. The method of claim 9 and further comprising:
providing an access door removably covering said opening; and
moving said access door from said opening prior to said translating said frame.

11. The method of claim 9 and further comprising:
providing a slide;
providing a pivot attached to said slide;
wherein said translating said frame comprises actuating said slide; and
wherein said pivoting said frame comprises actuating said pivot.

12. An electronic apparatus comprising:
a chassis;
a frame translatingly and pivotally attached to said chassis;
an electronic component removably attached to said frame; and
an access door formed in said chassis, wherein said frame is translatable through said access door.

13. The apparatus of claim 12 and further comprising:
a first pivot attached to said frame.

14. The apparatus of claim 12 wherein:
said apparatus comprises a first condition and a second condition;
said chassis defines a bottom;
in said first condition, said frame is parallel to said bottom; and
in said second condition, said frame is transverse to said bottom.

15. The apparatus of claim 12 and further comprising:
a connector attached to said frame, said connector electrically interfaced with said electronic component;
a receptacle attached to said chassis; and
wherein said receptacle electronically couples with said connector.

16. The apparatus of claim 13 and further comprising:
a first slide attached to said chassis and said first pivot.

17. The apparatus of claim 13 and further comprising:
a second pivot attached to said frame, said second pivot being aligned with said first pivot; and
a second slide attached to said chassis and said second pivot.

18. The apparatus of claim 16 wherein:
said slide comprises:
a guide formed on said first slide;
a rail slidingly interfaced with said guide; and
said first pivot is attached to said rail.

19. The apparatus of claim 17 wherein said first slide is registered to said second slide.

20. An electronic apparatus comprising:
a chassis;
a frame translatingly and pivotally attached to said chassis; and
an electronic component removably attached to said frame;
a connector attached to said frame, said connector electrically interfaced with said electronic component;
a receptacle attached to said chassis; and
wherein said receptacle electronically couples with said connector.

21. The apparatus of claim 20 and further comprising:
a first pivot attached to said frame.

22. The apparatus of claim 20 wherein:
said apparatus comprises a first condition and a second condition;
said chassis defines a bottom;
in said first condition, said frame is parallel to said bottom; and
in said second condition, said frame is transverse to said bottom.

23. The apparatus of claim 21 and further comprising:
a first slide attached to said chassis and said first pivot.

24. The apparatus of claim 21 and further comprising:
a second pivot attached to said frame, said second pivot being aligned with said first pivot; and
a second slide attached to said chassis and said second pivot.

25. The apparatus of claim 23 wherein:
said slide comprises:
a guide formed on said first slide;
a rail slidingly interfaced with said guide; and
said first pivot is attached to said rail.

26. The apparatus of claim 24 wherein said first slide is registered to said second slide.

* * * * *